(12) United States Patent
Jeong

(10) Patent No.: US 8,987,768 B2
(45) Date of Patent: Mar. 24, 2015

(54) SEMICONDUCTOR LIGHT EMITTING DEVICE HAVING ROUGHNESS LAYER

(71) Applicant: LG Innotek Co., Ltd., Seoul (KR)

(72) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/249,133

(22) Filed: Apr. 9, 2014

(65) Prior Publication Data

US 2014/0217418 A1 Aug. 7, 2014

Related U.S. Application Data

(63) Continuation of application No. 12/883,554, filed on Sep. 16, 2010, now Pat. No. 8,723,202, which is a continuation of application No. 12/340,354, filed on Dec. 19, 2008, now Pat. No. 7,821,024.

(30) Foreign Application Priority Data

Dec. 20, 2007 (KR) .......................... 10-2007-0133919

(51) Int. Cl.
| | |
|---|---|
| *H01L 33/00* | (2010.01) |
| *H01L 33/22* | (2010.01) |
| *H01L 33/04* | (2010.01) |
| *H01L 33/32* | (2010.01) |

(52) U.S. Cl.
CPC .............. *H01L 33/22* (2013.01); *H01L 33/04* (2013.01); *H01L 33/32* (2013.01)
USPC ...................................... 257/98; 257/E33.063

(58) Field of Classification Search
USPC .............. 257/98, E33.006, E33.062, E33.063
See application file for complete search history.

(56) References Cited

U.S. PATENT DOCUMENTS

| | | | |
|---|---|---|---|
| 6,441,403 B1 | 8/2002 | Chang et al. | |
| 6,469,324 B1 | 10/2002 | Wang | |
| 6,900,473 B2 | 5/2005 | Yoshitake et al. | |
| 8,723,202 B2 * | 5/2014 | Jeong ............................ | 257/98 |
| 2002/0195609 A1 * | 12/2002 | Yoshitake et al. ............. | 257/81 |
| 2004/0164281 A1 | 8/2004 | Abe et al. | |
| 2005/0224811 A1 | 10/2005 | Chae et al. | |

FOREIGN PATENT DOCUMENTS

| | | |
|---|---|---|
| KR | 10-2003-0001326 A | 1/2003 |
| KR | 10-0699056 B1 | 3/2007 |

OTHER PUBLICATIONS

English Translation of KR-10-0699056-B1, published Mar. 23, 2007.

* cited by examiner

*Primary Examiner* — Thomas L Dickey
(74) *Attorney, Agent, or Firm* — Birch, Stewart, Kolasch & Birch, LLP

(57) ABSTRACT

A semiconductor light emitting device is provided, including a substrate, a first conductive semiconductor layer, an active layer, and a second conductive semiconductor layer that includes a top surface and a bottom surface. The device includes a first roughness layer having a random horn shape and formed with irregular intervals, a second roughness layer, and at least one of a first AlGaN based semiconductor layer and a second AlGaN based semiconductor layer. The second conductive semiconductor layer includes a plurality of apexes on the top surface, where the distance between at least two apexes is of about 0.3 μm to about 1.0 μm. The second roughness layer includes a lower surface having a shape corresponding to the top surface of the second conductive semiconductor layer. The second roughness layer includes an upper surface having a shape corresponding to a top surface of the first roughness layer.

20 Claims, 9 Drawing Sheets

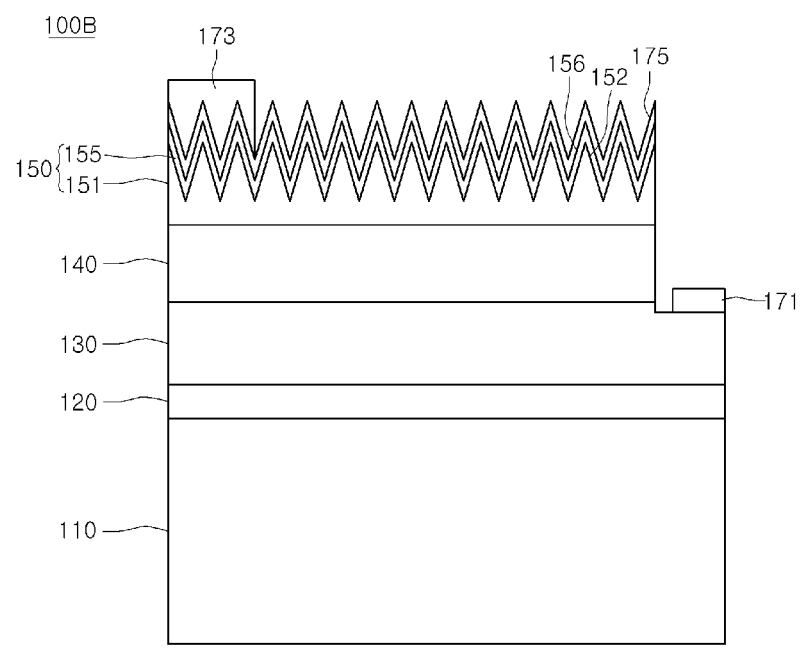

US 8,987,768 B2

SEMICONDUCTOR LIGHT EMITTING DEVICE HAVING ROUGHNESS LAYER

CROSS-REFERENCE TO RELATED APPLICATIONS

This application is a Continuation of copending application Ser. No. 12/883,554 filed on Sep. 16, 2010, which claims priority to copending Continuation application Ser. No. 12/340,354 filed on Dec. 19, 2008 (now U.S. Pat. No. 7,821,024 issued Oct. 26, 2014), which claims priority under 35 U.S.C. 119(a) to Korean Patent Application No. 10-2007-0133919 filed on Dec. 20, 2007. The contents of all these applications are hereby incorporated by reference in their entirety.

BACKGROUND

The present disclosure relates to a semiconductor light emitting device.

Group III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the fabrication process or light efficiency of the nitride semiconductor.

SUMMARY

Embodiments provide a semiconductor light emitting device comprising a second conductive semiconductor layer with a dual roughness structure.

Embodiments provide a semiconductor light emitting device comprising a second conductive semiconductor layer with a horn-shaped dual roughness structure.

Embodiments provide a semiconductor light emitting device, which is capable of enhancing external quantum efficiency by forming a horn-shaped dual roughness structure in a second conductive semiconductor layer.

An embodiment provides a semiconductor light emitting device comprising: a first conductive semiconductor layer; an active layer on the first conductive semiconductor layer; and a second conductive semiconductor layer comprising a dual roughness structure on the active layer.

An embodiment provides a semiconductor light emitting device comprising: a first conductive semiconductor layer; an active layer on the first conductive semiconductor layer; and a second conductive semiconductor layer on the active layer, wherein the second conductive semiconductor layer comprises: a first semiconductor layer comprising a shape of multiple horns; and a roughness layer ohmic-contacted on the first semiconductor layer.

An embodiment provides a semiconductor light emitting device comprising: a substrate; a first conductive semiconductor layer on the substrate; an active layer on the first conductive semiconductor layer; and a second conductive semiconductor layer comprising a dual roughness structure of a shape a multiple horns on the active layer.

BRIEF DESCRIPTION OF THE DRAWINGS

FIG. 1 is a side sectional view of a semiconductor light emitting device according to a first embodiment, while

FIG. 9 is a side sectional view of a semiconductor light emitting device according to a third embodiment.

DETAILED DESCRIPTION OF THE EMBODIMENTS

Hereinafter, a semiconductor light emitting device according to the embodiment will be described with reference to the accompanying drawings. In the description of the embodiment, it will be understood that, when a layer (or film), a region, a pattern, or a structure is referred to as being "on (above/over/upper)" or "under(below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads, or patterns, it can be the only layer between the two layers (or films), regions, pads, or patterns or one or more intervening layers may also be present. Thus, it should be determined by technical idea of the invention.

Figure 1:
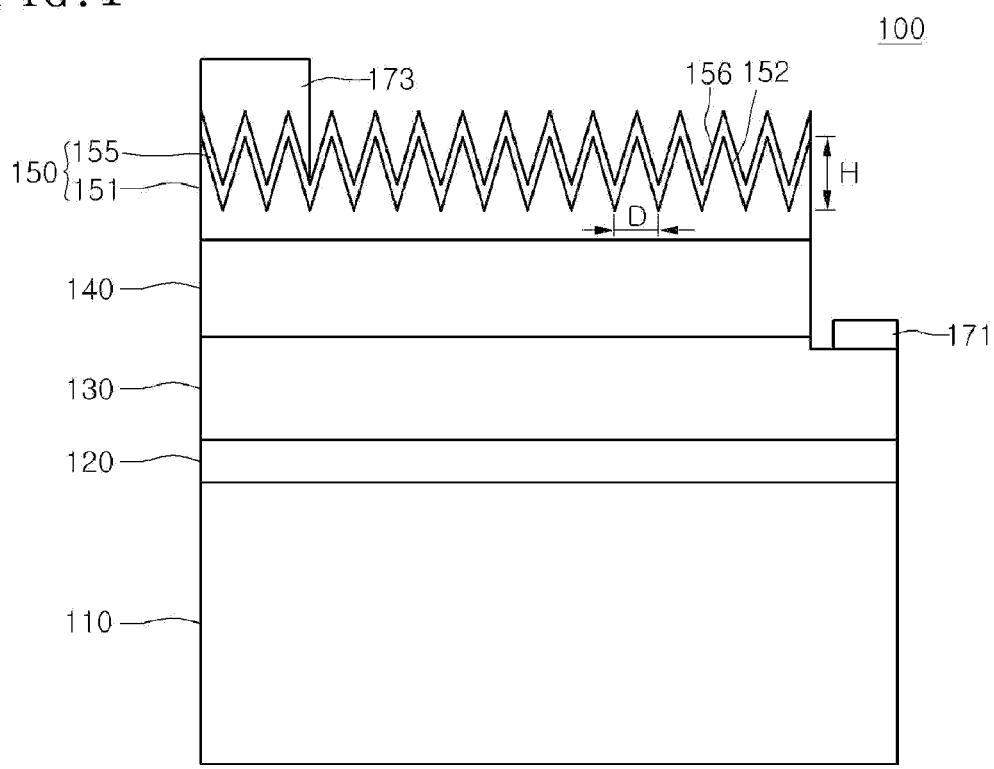

FIG. 1 is a side sectional view of a semiconductor light emitting device according to a first embodiment.

Referring to FIG. 1, a semiconductor light emitting device 100 comprises a substrate 110, a buffer layer 120, a first conductive semiconductor layer 130, an active layer 140, a second conductive semiconductor layer 150 having dual roughness 152 and 156, a first electrode 171, and a second electrode 173.

The substrate 110 may be formed of a material selected from the group consisting of sapphire ($Al_2O_3$), GaN, SiC, ZnO, Si, GaP, and GaAs. Concave-convex patterns may be formed on the substrate 110, but the present invention is not limited thereto.

The buffer layer 120 is formed on the substrate 110. The buffer layer 120 is a layer for reducing a lattice constant difference from the substrate 110. The buffer layer 120 may be formed to a predetermined thickness (for example, about 140 Å to about 1,000 Å) by selectively using GaN, AlN, AlGaN, InGaN, or AlInGaN.

An undoped semiconductor layer (not shown) may be formed on the buffer layer 120 or the substrate 110. The undoped semiconductor layer (not shown) may comprise an undoped GaN-based layer. Neither of the buffer layer 120 and the undoped semiconductor layer (not shown) may be formed on the substrate 110, or at least one of them may be formed on the substrate 110.

At least one first conductive semiconductor layer 130 is formed on the buffer layer 120. The first conductive semiconductor layer 130 is a semiconductor layer doped with a first conductive dopant. The first conductive semiconductor layer 130 may be formed of a semiconductor material having a composition formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlN, or InN. When the first conductive semiconductor layer 130 is an N-type semiconductor layer, the first conductive dopant is an N-type dopant, such as Si, Ge, or Sn.

The active layer 140 is formed on the first conductive semiconductor layer 130. The active layer 140 may have a single quantum well structure or a multiple quantum well structure. The active layer 140 may be formed of InGaN/GaN or AlGaN/GaN by using group III-V compound semiconductors.

Figure 1A:
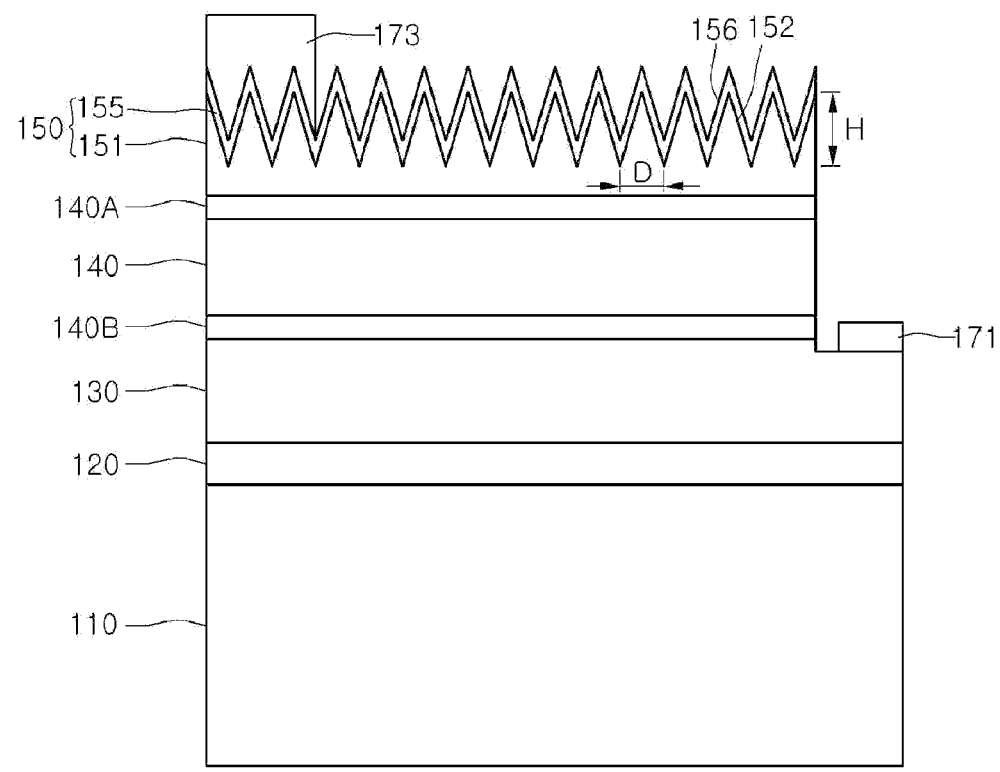
FIG. 1A is a side sectional view of a semiconductor light emitting device according to an embodiment related to the first embodiment.

The active layer 140 is formed of a material having a bandgap energy according to a light wavelength at which light is emitted. For example, in the case of a blue light emission having a wavelength range from 460 nm to 470 nm, the active layer 140 may be formed in a single or multiple quantum well structure at a period of an InGaN well layer/GaN barrier layer. The active layer 140 may comprise a material emitting a colored light such as a blue wavelength light, a red wavelength light, and a green wavelength light. A conductive clad layer 140A and/or 140B may be formed over and/or under the active layer 140 as shown in FIG. 1A, and the conductive clad layer 140A and/or 140B comprises an AlGaN-based layer.

The second conductive semiconductor layer 150 is formed on the active layer 140. The second conductive semiconductor layer 150 is a semiconductor layer doped with a second conductive dopant. The second conductive semiconductor layer 150 may be formed of a semiconductor material having a composition formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlN, or InN. When the second conductive semiconductor layer 150 is a P-type semiconductor layer, the second conductive dopant is a P-type dopant, such as Mg, Zn, Ca, Sr, or Ba.

The first conductive semiconductor layer 130, the active layer 140, and the second conductive semiconductor layer 150 serve as a light emitting structure. The light emitting structure may be formed in one of an N-P junction structure, a P-N junction structure, an N-P-N junction structure, and a P-N-P junction structure.

The second conductive semiconductor layer 150 comprises a first semiconductor layer 151 and a roughness layer 155.

The first semiconductor layer 151 is a P-type semiconductor layer doped with a second conductive dopant and may be formed of InAlGaN, GaN, AlGaN, InGaN, AlN, or InN. The first semiconductor layer 151 has a first roughness 152 on the top surface thereof, and the first roughness 152 may be formed in a shape of multiple horns.

The first roughness 152 may have a structure in which horn-shaped apex patterns and inverse-horn-shaped valley patterns are alternately arranged.

The first roughness 152 may have a height (H) of about 0.5 μm to about 1.2 μm and a diameter (D) of about 0.3 μm to about 1.0 μm. The height (H) of the first roughness 152 may be that of the horn-shaped apex pattern, and the diameter (D) of the first roughness 152 may be length between two the apexes or between two valleys. The first roughness 152 may have a horn shape, a polygonal horn shape, or a random horn shape, and may be formed at irregular intervals.

The roughness layer 155 is formed on the first semiconductor layer 151. The roughness layer 155 is a P-type semiconductor layer doped with a second conductive dopant and may be formed of InAlGaN, GaN, AlGaN, InGaN, AlN, or InN.

The roughness layer 155 is ohmic-contacted with the first semiconductor layer 151 and may be formed to a predetermined thickness of about 1,000 Å to about 2,000 Å.

The roughness layer 155 is formed with a second roughness 156. The second roughness 156 may be formed in the same shape as the first roughness 152. The second roughness 156 may have a structure in which horn-shaped apex patterns and inverse-horn-shaped valley patterns are arranged regularly or irregularly.

The first semiconductor layer 151 and the roughness layer 155 may be formed of the same semiconductor materials or the different semiconductor materials.

The second electrode 173 is formed on the roughness layer 155 of the second conductive semiconductor layer 150, and the second electrode 173 may have predetermined patterns. The first electrode 171 may be formed on or electrically connected to the first conductive semiconductor layer 130.

By forming the first roughness and the second roughness having a shape of multiple horns in the second conductive semiconductor layer 150, external quantum efficiency can be enhanced. That is, the horn-shaped first rough 152 and the horn-shaped second roughness 156 change the incident angle of light emitted from the active layer 140, thereby enhancing light emission efficiency.

FIGS. 2 through 7 are sectional views illustrating a method for manufacturing a semiconductor light emitting device according to a first embodiment.

Figure 2:
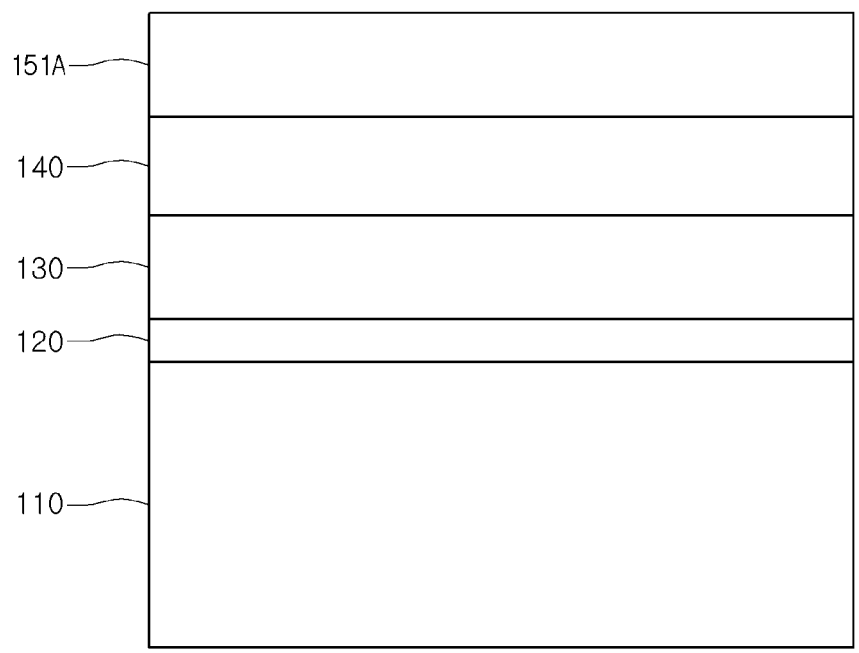
FIGS. 2 through 7 are sectional views illustrating a method for fabricating a semiconductor light emitting device according to a first embodiment.

Referring to FIG. 2, a buffer layer 120, a first conductive semiconductor layer 130, an active layer 140, and a first semiconductor layer 151A of a second conductive semiconductor layer are formed on a substrate 110.

The substrate 110 may be formed of a material selected from the group consisting of sapphire ($Al_2O_3$), GaN, SiC, ZnO, Si, GaP, and GaAs. The buffer layer 120 is formed on the substrate 110 and may be formed of GaN, AlN, AlGaN, InGaN, or AlInGaN. An undoped semiconductor layer (not shown) may be formed on the buffer layer 120 or the substrate 110. The undoped semiconductor layer (not shown) may comprise an undoped GaN-based layer. Neither of the buffer layer 120 and the undoped semiconductor layer (not shown) may be formed on the substrate 110, or at least one of them may be formed.

At least one first conductive semiconductor layer 130 is formed on the buffer layer 120. The first conductive semiconductor layer 130 may comprise an N-type semiconductor layer. The first conductive semiconductor layer 130 may be formed of a semiconductor material having a composition formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlN, or InN. The first conductive semiconductor layer 130 comprises an N-type dopant, such as Si, Ge, or Sn.

The active layer 140 is formed on the first conductive semiconductor layer 130. The active layer 140 may have a single quantum well structure or a multiple quantum well structure. The active layer 140 may be formed of InGaN/GaN or AlGaN/GaN by using group III-V compound semiconductors. The active layer 140 may comprise a material emitting a colored light such as a blue wavelength light, a red wavelength light, and a green wavelength light.

A conductive clad layer (not shown) may be formed over and/or under the active layer 140. The conductive clad layer (not shown) comprises an AlGaN-based layer.

The first semiconductor layer 151A of the second conductive semiconductor layer is formed on the active layer 140. The first semiconductor layer 151A may comprise a P-type semiconductor layer. The first semiconductor layer 151A may be formed of a semiconductor material having a composition formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlN, or InN. The first semiconductor layer 151A may comprise a P-type dopant such as Mg, Zn, Ca, Sr, or Ba. The first semiconductor layer 151A may be formed to a predetermined thickness of about 0.7 μm to about 1.5 μm.

Figure 3:
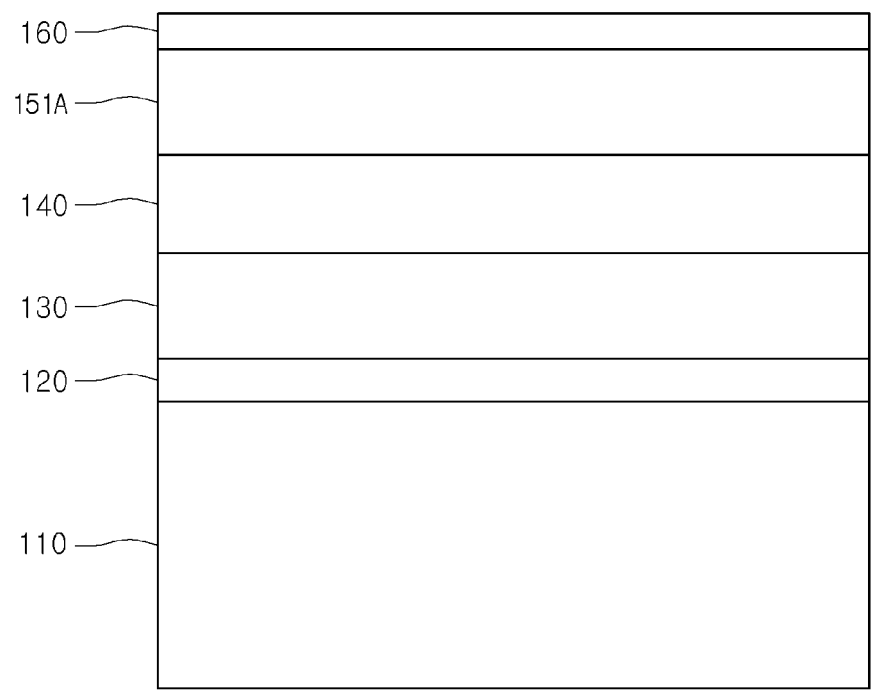
Figure 4:
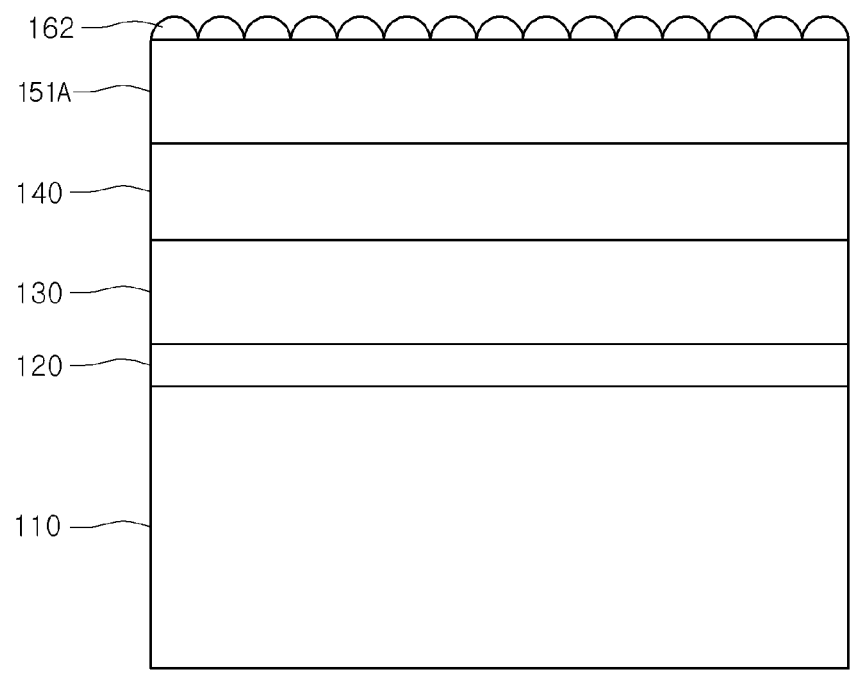

Referring to FIGS. 3 and 4, a removal layer 160 is formed on the first semiconductor layer 151A. The removal layer 160 is formed in a thin film type by selectively using indium tin oxide (ITO), indium zinc oxide (IZO), aluminum zinc oxide (AZO), silver (Ag), and aluminum (Al).

A first etching process is performed on the removal layer 160. The first etching process uses a wet etchant (for example, HCl solution). The removal layer 160 is formed in a shape of multiple island patterns 162 by a wet etching process.

The island patterns 162 may have an embossing shape, a semispherical shape, or a convex lens shape, or may be formed regularly or irregularly with an irregular size and a random shape. The shape and size of the island patterns 162 may be different according to a material of the removal layer 160 or an etching degree.

Figure 5:
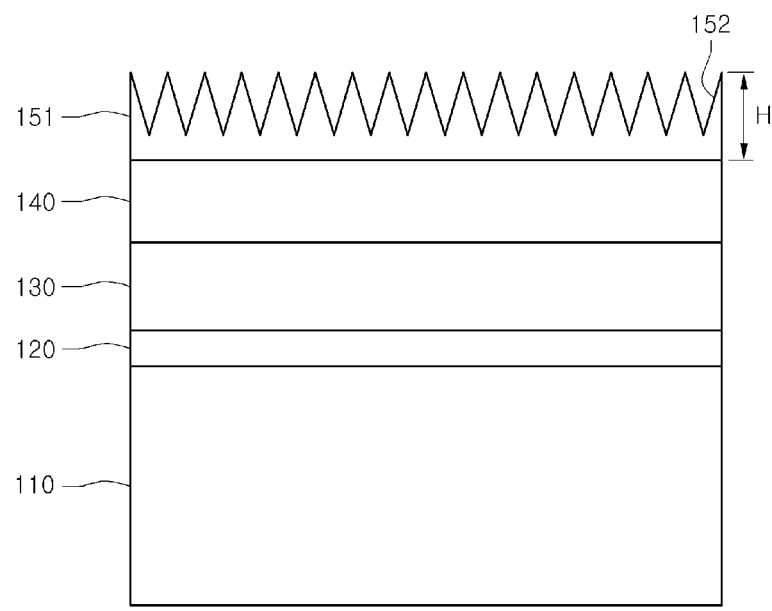

Referring to FIGS. 4 and 5, a second etching process is performed on the island patterns 162. The second etching process may be performed by a dry etching process.

The second etching process may be performed from the multiple island patterns 162 to a predetermined portion of the first semiconductor layer 151A.

The dry etching process may be performed by selectively using an Inductively Coupled Plasma (ICP) apparatus, a Reactive Ion Etching (RIE) apparatus, a Capacitively Coupled Plasma (CCP) apparatus, and an Electron Cyclotron Resonance (ECR) apparatus.

An etching depth of the first semiconductor layer 151A is changed according to a material difference (strength difference) and a thickness difference of the island patterns 162. Accordingly, the first semiconductor layer 151 has a first roughness 152 having a shape of multiple horns on the top surface thereof.

The first roughness 152 of the first semiconductor layer 151 is formed in an apex/valley patterns. The valley patterns are formed by a relatively thin island pattern region, and the apex patterns are formed by a relatively thick island pattern region.

The first roughness 152 of the first semiconductor layer 151 may be formed in a horn shape, a polygonal horn shape, or a random horn shape, and may be formed at dense intervals.

The first roughness 152 may have a height (H) of about 0.5 µm to about 1.2 µm and a diameter (D) of about 0.3 µm to about 1.0 µm.

Figure 6:
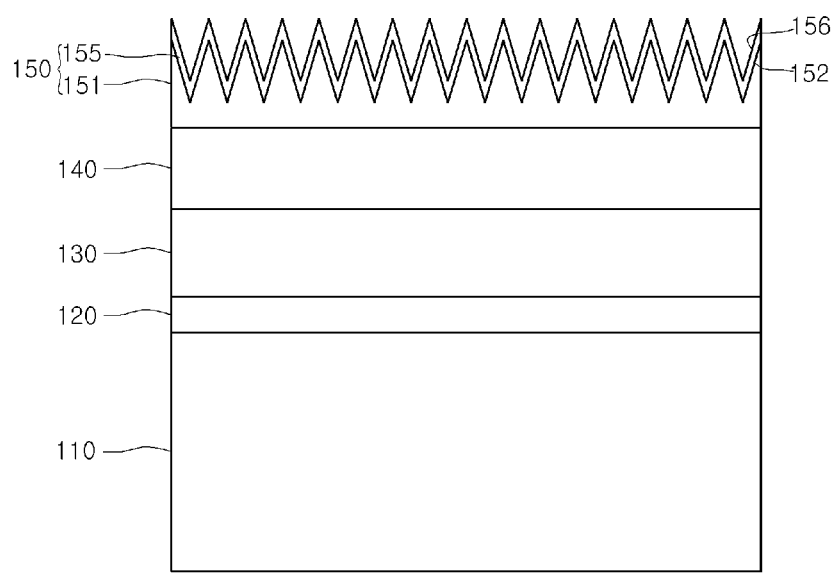

Referring to FIG. 6, a roughness layer 155 is formed on the first semiconductor layer 151. The first semiconductor layer 151 and the roughness layer 155 define a second conductive semiconductor layer 150.

The roughness layer 155 may be a P-type semiconductor layer. The roughness layer 155 may be formed of a semiconductor material having a composition formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlN, or InN. The roughness layer 155 may comprise a P-type dopant such as Mg, Zn, Ca, Sr, or Ba.

The roughness layer 155 may be formed to a predetermined thickness of about 1,000 Å to about 2,000 Å and is ohmic-contacted with the first semiconductor layer 151. A second roughness 156 having the same shape as the first roughness 152 is formed in the roughness layer 155.

The second conductive semiconductor layer 150 may have a structure in which a dual structure of the first roughness 152 and the second roughness 156 is formed in a horn shape.

Figure 7:
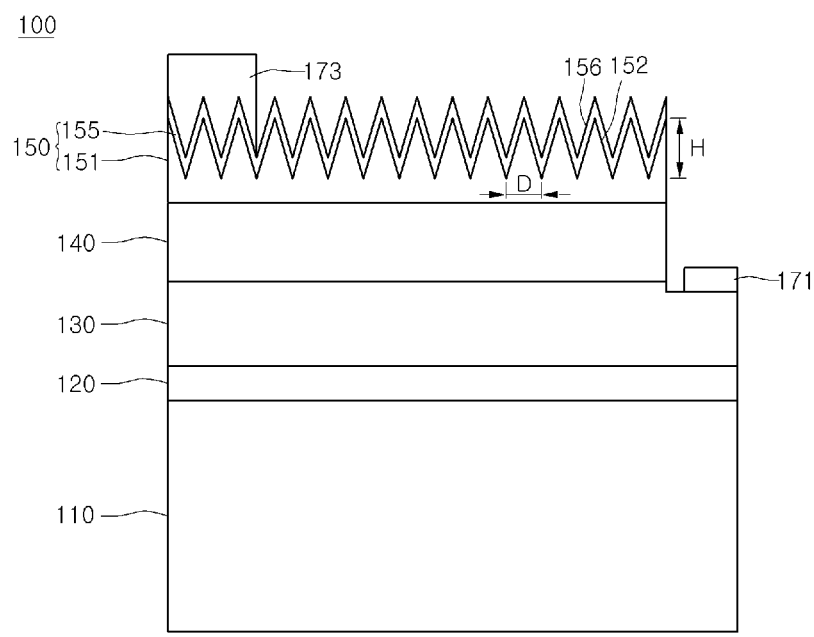

Referring to FIG. 7, a mesh etching process is performed to expose a portion of the first conductive semiconductor layer 130.

A first electrode 171 is formed on the first conductive semiconductor layer 130, and a second electrode 173 is formed on the second conductive semiconductor layer 150.

In the semiconductor light emitting device 100 according to the current embodiment, the dual structure of the horn-shaped roughness 152 and 156 is formed in the second conductive semiconductor layer 150. Thus, the incident angle of light emitted from the active layer 140 can be changed, thereby enhancing external quantum efficiency.

Figure 8:
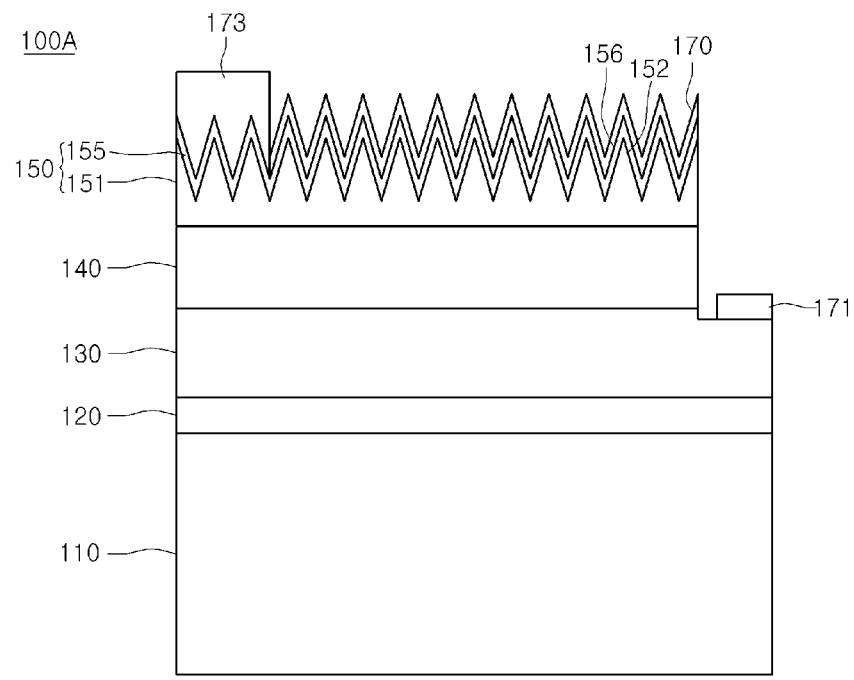
FIG. 8 is a side sectional view of a semiconductor light emitting device according to a second embodiment.

FIG. 8 is a side sectional view of a semiconductor light emitting device according to a second embodiment. In the first and second embodiments, like reference numerals refer to like elements and duplicate description will be omitted.

Referring to FIG. 8, the semiconductor light emitting device 100A comprises a substrate 110, a buffer layer 120, a first conductive semiconductor layer 130, an active layer 140, a second conductive semiconductor layer 150 having dual roughness 152 and 156, a transparent electrode layer 170, a first electrode 171, and a second electrode 173.

The transparent electrode layer 170 is formed on the second conductive semiconductor layer 150 and may have a roughness structure.

The transparent electrode layer 170 may have a roughness with a shape of multiple horns along the roughness layer 155 of the second conductive semiconductor layer 150. Accordingly, a triple structure of horn-shaped roughness may be formed on the active layer 140.

The transparent electrode layer 170 may comprise at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), ZnO, RuOx, TiOx, IrOx, and $SnO_2$.

The second electrode 173 may be formed on the roughness layer 155 of the second conductive semiconductor layer 150, or may be formed on the transparent electrode layer 170 and/or the roughness layer 155.

FIG. 9 is a side sectional view of a semiconductor light emitting device according to a third embodiment. In the first and third embodiments, like reference numerals refer to like elements and duplicate description will be omitted.

Referring to FIG. 9, the semiconductor light emitting device 100B comprises a substrate 110, a buffer layer 120, a first conductive semiconductor layer 130, an active layer 140, a second conductive semiconductor layer 150 having dual roughness 152 and 156, a third conductive semiconductor layer 170, a first electrode 171, and a second electrode 173.

The third conductive semiconductor layer 175 may comprise an N-type semiconductor layer or a P-type semiconductor layer. For example, when the first conductive semiconductor layer 130 is an N-type semiconductor layer, the third conductive semiconductor layer 175 may be an N-type semiconductor layer. When the first conductive semiconductor layer 130 is a P-type semiconductor layer, the third conductive semiconductor layer 175 may be a P-type semiconductor layer.

The third conductive semiconductor layer 175 may have a roughness with a shape of multiple horns along the roughness layer 155 of the second conductive semiconductor layer 150. Accordingly, a triple structure of horn-shaped roughness may be formed on the active layer 140.

Furthermore, a transparent electrode layer (not shown) may be formed on the third conductive semiconductor layer 175, and the transparent electrode layer (not shown) can diffuse a current to a whole region.

The second electrode 173 may be formed on the third conductive semiconductor layer 175, but the present invention is not limited thereto.

The semiconductor light emitting device according to the current embodiment may be formed in a P-N structure, an N-P structure, an N-P-N structure, and a P-N-P structure. Accordingly, the second conductive semiconductor layer 150 may be implemented with an N-type semiconductor layer or a P-type semiconductor layer.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a substrate;
a first conductive semiconductor layer on the substrate;
an active layer on the first conductive semiconductor layer;
a second conductive semiconductor layer on the active layer, the second conductive semiconductor layer including a top surface and a bottom surface opposing to the top surface, the bottom surface being adjacent to the active layer;
a first roughness layer disposed on the second conductive semiconductor layer and including Al material, the first roughness layer including a random horn shape and formed with irregular intervals;
a second roughness layer including Ti material on the first roughness layer; and
at least one of a first AlGaN based semiconductor layer disposed on the active layer and a second AlGaN based semiconductor layer disposed under the active layer,
wherein the first conductive semiconductor layer includes a first GaN layer and the second conductive semiconductor layer includes a second GaN layer,
wherein the second conductive semiconductor layer includes a plurality of apexes on the top surface, the distance between at least two apexes of the plurality of apexes is of about 0.3 μm to about 1.0 μm,
wherein the second roughness layer includes a lower surface having a shape corresponding to the top surface of the second conductive semiconductor layer, and
wherein the second roughness layer includes an upper surface having a shape corresponding to a top surface of the first roughness layer.

2. The semiconductor light emitting device according to claim 1, further comprising an electrode on the second conductive semiconductor layer, wherein the electrode has a bottom surface with a shape corresponding to the top surface of the second conductive semiconductor layer.

3. The semiconductor light emitting device according to claim 1, wherein the second roughness layer is disposed directly on the first roughness layer.

4. The semiconductor light emitting device according to claim 1, wherein the first roughness layer includes an upper surface having a shape corresponding to the top surface of the second conductive semiconductor layer.

5. The semiconductor light emitting device according to claim 1, wherein the first roughness layer is a semiconductor layer.

6. The semiconductor light emitting device according to claim 1, wherein the first roughness layer is formed of a same semiconductor material as that of the second conductive semiconductor layer.

7. The semiconductor light emitting device according to claim 1, wherein the first roughness layer has a thickness of about 1000 Å to about 2000 Å.

8. The semiconductor light emitting device according to claim 1, wherein a distance between one apex of the plurality of apexes and a valley that is positioned close thereto is in the range of about 0.5 μm to about 1.2 μm.

9. A semiconductor light emitting device, comprising:
a first conductive semiconductor layer;
an active layer on the first conductive semiconductor layer;
a second conductive semiconductor layer on the active layer;
a first roughness layer on the second conductive semiconductor layer and including Al material, the first roughness layer including a random horn shape and formed with irregular intervals; and
a second roughness layer on the first roughness layer and including Ti material, wherein a top surface of the second conductive semiconductor layer includes a roughness,
wherein the first roughness layer includes a lower surface having a shape corresponding to the top surface of the second conductive semiconductor layer,
wherein the second roughness layer includes an upper surface having a shape corresponding to a top surface of the first roughness layer, and
wherein the second roughness layer includes a lower surface having a shape corresponding to the top surface of the second conductive semiconductor layer.

10. The semiconductor light emitting device according to claim 9, wherein the first conductive semiconductor layer includes a first GaN layer and the second conductive semiconductor layer includes a second GaN layer.

11. The semiconductor light emitting device according to claim 9, wherein the second conductive semiconductor layer includes a plurality of apexes on the top surface, the distance between at least two apexes of the plurality of apexes is of about 0.3 μm to about 1.0 μm.

12. The semiconductor light emitting device according to claim 9, wherein a distance between one apex of the plurality of apexes and a valley that is positioned close thereto is in the range of about 0.5 μm to about 1.2 μm.

13. The semiconductor light emitting device according to claim 9, further comprising an electrode on the first roughness layer, wherein the electrode has a bottom surface with a shape corresponding to the top surface of the second conductive semiconductor layer.

14. The semiconductor light emitting device according to claim 9, wherein the second roughness layer is disposed directly on the first roughness layer.

15. The semiconductor light emitting device according to claim 9, wherein the first roughness layer includes an upper surface having a shape corresponding to the top surface of the second conductive semiconductor layer.

16. The semiconductor light emitting device according to claim 9, wherein the first roughness layer has a thickness of about 1000 Å to about 2000 Å.

17. The semiconductor light emitting device according to claim 9, further comprising an AlGaN based semiconductor layer disposed on the active layer.

18. A light emitting device, comprising:
a substrate;
a first conductive semiconductor layer on the substrate;
an active layer on the first conductive semiconductor layer;
a conductive clad layer on the active layer, the conductive clad layer comprising an AlGaN-based layer;
a second conductive semiconductor layer on the conductive clad layer, the second conductive semiconductor layer including a top surface and a bottom surface being close to the second conductive semiconductor layer, the top surface including a roughness having a random horn shape;
a first roughness layer on the roughness of the top surface of the second conductive semiconductor layer, the first roughness layer having a roughness with a random horn shape and being formed of the same material as the second conductive semiconductor layer or different material including Al;
a second roughness layer on the first roughness layer, the second roughness layer having a roughness with a random horn shape, the second roughness layer comprising a material including Ti; and
an electrode on the first roughness layer, the electrode having a bottom surface having a roughness with a random horn shape,
wherein the roughness of the top surface of the second conductive semiconductor layer includes a plurality of apexes, the distance between at least two apexes of the plurality of apexes is in the range of about 0.3 μm to about 1.0 μm,
wherein a distance between one apex of the plurality of apexes and a valley that is positioned close thereto is in the range of about 0.5 μm to about 1.2 μm,
wherein the roughness of the first roughness layer has the same shape corresponding to the roughness of the second conductive semiconductor layer, and
wherein the roughness of the second roughness layer has the same shape corresponding to the roughness of the first roughness layer.

19. The light emitting device according to claim 18, wherein the second roughness layer is disposed directly on the first roughness layer.

20. The light emitting device according to claim 18, wherein the first roughness layer has a thickness of about 1000 Å to about 2000 Å.

* * * * *